US009881948B2

(12) United States Patent
Sun et al.

(10) Patent No.: US 9,881,948 B2
(45) Date of Patent: Jan. 30, 2018

(54) ARRAY SUBSTRATE AND DISPLAY APPARATUS CONTAINING THE SAME, AND METHOD FOR FABRICATING THE SAME

(71) Applicant: BOE TECHNOLOGY GROUP CO., LTD, Beijing (CN)

(72) Inventors: Jianming Sun, Beijing (CN); Ben Niu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/108,736

(22) PCT Filed: Dec. 10, 2015

(86) PCT No.: PCT/CN2015/096906
§ 371 (c)(1),
(2) Date: Jun. 28, 2016

(87) PCT Pub. No.: WO2017/020469
PCT Pub. Date: Feb. 9, 2017

(65) Prior Publication Data
US 2017/0040355 A1    Feb. 9, 2017

(30) Foreign Application Priority Data

Aug. 6, 2015   (CN) .......................... 2015 1 0477837

(51) Int. Cl.
*H01L 27/14* (2006.01)
*H01L 29/04* (2006.01)
(Continued)

(52) U.S. Cl.
CPC ...... *H01L 27/1443* (2013.01); *H01L 27/1446* (2013.01); *H01L 27/1214* (2013.01);
(Continued)

(58) Field of Classification Search
CPC ............ H01L 27/1443; H01L 27/1446; H01L 31/02327; H01L 31/0224; H01L 27/1214; H01L 31/101; H01L 31/09
See application file for complete search history.

(56) References Cited

U.S. PATENT DOCUMENTS

2005/0179964 A1    8/2005   Izumi
2009/0059554 A1*   3/2009   Skipor ................... G06F 1/3218
                                                       362/614
(Continued)

FOREIGN PATENT DOCUMENTS

CN        1663047 A      8/2005
CN      101533869 A      9/2009
(Continued)

OTHER PUBLICATIONS

The World Intellectual Property Organization (WIPO) International Search Report for PCT/CN2015/096906 dated May 9, 2016.
(Continued)

*Primary Examiner* — Victor A Mandala
(74) *Attorney, Agent, or Firm* — Anova Law Group, PLLC

(57) ABSTRACT

The present disclosure provides an array substrate. The array substrate includes a substrate; and at least one ultraviolet (UV) detection structure. The UV detection structure includes a photosensitive pattern on the substrate, and a first electrode pattern and a second electrode pattern for providing an operating voltage for the at least one UV detection structure.

18 Claims, 7 Drawing Sheets

(51) Int. Cl.
  *H01L 29/15* (2006.01)
  *H01L 31/036* (2006.01)
  *H01L 27/144* (2006.01)
  *H01L 31/09* (2006.01)
  *H01L 31/101* (2006.01)
  *H01L 27/12* (2006.01)
  *H01L 31/0224* (2006.01)
  *H01L 31/0232* (2014.01)

(52) U.S. Cl.
  CPC .... *H01L 31/0224* (2013.01); *H01L 31/02327* (2013.01); *H01L 31/09* (2013.01); *H01L 31/101* (2013.01)

(56) References Cited

U.S. PATENT DOCUMENTS

| | | | | |
|---|---|---|---|---|
| 2010/0090967 | A1* | 4/2010 | Jang | G06F 3/0412 345/173 |
| 2010/0253661 | A1* | 10/2010 | Hashimoto | G01J 1/02 345/207 |
| 2010/0327289 | A1* | 12/2010 | Cho | G02F 1/13318 257/72 |
| 2011/0133182 | A1* | 6/2011 | Saito | H01L 27/1214 257/43 |
| 2012/0126354 | A1* | 5/2012 | Jaworski | G01J 1/04 257/432 |
| 2012/0236190 | A1* | 9/2012 | Ogasahara | G02B 3/0056 348/302 |
| 2014/0183342 | A1* | 7/2014 | Shedletsky | G06F 1/1637 250/215 |
| 2014/0246667 | A1* | 9/2014 | Koyama | H01L 31/0296 257/43 |
| 2016/0149166 | A1* | 5/2016 | Kwong | H01L 51/5293 257/40 |
| 2017/0108372 | A1* | 4/2017 | Reichel | G01J 1/0214 |

FOREIGN PATENT DOCUMENTS

| | | |
|---|---|---|
| CN | 102891150 A | 1/2013 |
| CN | 105047674 A | 11/2015 |

OTHER PUBLICATIONS

State Intellectual Property Office of the P.R.C (SIPO) Office Action 1 for 201510477837.X dated Jun. 27, 2017 21 Pages.

\* cited by examiner

ARRAY SUBSTRATE AND DISPLAY APPARATUS CONTAINING THE SAME, AND METHOD FOR FABRICATING THE SAME

CROSS-REFERENCES TO RELATED APPLICATIONS

This PCT patent application is a national phase entry under 35 U.S.C. §371 of International Application No. PCT/CN2015/096906, filed on Dec. 10, 2015, which claims priority of Chinese Patent Application No. 201510477837.X, filed on Aug. 6, 2015. The above enumerated patent applications are incorporated by reference herein in their entirety.

FIELD OF THE INVENTION

The present invention generally relates to the display technologies and, more particularly, relates to an array substrate and a display apparatus including the same, and a method for fabricating the same.

BACKGROUND

In daily life, strong ultraviolet (UV) radiations often cause damage to people's skin. How to detect the intensity of UV radiations in real time has drawn much attention.

To solve the problem mentioned above, UV detectors have been incorporated in people's carry-on items, e.g., cell phones, for people to detect intensity of UV radiations at any time. Often, cell phones and UV detectors are often manufactured separately. The UV detector is then fixed or mounted on a cell phone at a predetermined position.

Thus, the mounting of the UV detector is often after the fabrication of the cell phone, which may increase the cost of fabricating the cell phone. More importantly, during the mounting of the UV detector, the cell phone may be damaged.

BRIEF SUMMARY OF THE DISCLOSURE

The present disclosure provides an array substrate and a display apparatus including the array substrate, and the method for fabricating the array substrate. By using the method and the array substrate, a UV detection structure can be incorporated or integrated on the array substrate. The UV detection structure may be fabricated during the fabrication process of an existing array substrate. That is, the UV detection structure may be fabricated with the array substrate through the same fabrication process. Embodiments of the present disclosure can thus reduce the fabrication steps and fabrication cost of the array substrate.

One aspect of the present disclosure includes an array substrate. The array substrate includes an array substrate. The array substrate includes a substrate; and at least one ultraviolet (UV) detection structure. The UV detection structure includes a photosensitive pattern on the substrate, and a first electrode pattern and a second electrode pattern for providing an operating voltage for the at least one UV detection structure.

The array substrate further includes a plurality of driving transistors for driving corresponding pixel units to display images. The plurality of driving transistors are in an active area and the at least one UV detection structure is in a peripheral region, the active area being a display region and the peripheral region being a non-display region. The photosensitive pattern of the at least one UV detection structure and an active layer pattern of a driving transistor are formed in a same fabrication step and made of a same material.

Optionally, the first electrode pattern and the second electrode pattern of the at least one UV detection structure and a source pattern and a drain pattern of the driving transistor are formed in a same fabrication step and made of a same material.

Optionally, the first electrode pattern and the second electrode pattern are configured to provide the operating voltage on the photosensitive pattern so that an output electric current of the at least one UV detection structure changes according to different intensities of UV light.

Optionally, the photosensitive pattern is made of a semiconductor material with a wide bandgap.

Optionally, the semiconductor material is zinc oxide, indium gallium zinc oxide, or a combination thereof.

Optionally, the at least one UV detection structure further includes a light-blocking pattern on the substrate, the photosensitive pattern being on the light-blocking pattern.

Optionally, an orthogonal projection of the light-blocking pattern on the substrate fully encloses an orthogonal projection of the photosensitive pattern on the substrate.

Optionally, the first electrode pattern and the second electrode pattern form a staggered-fingers shape, a finger of the first electrode pattern having a width of about 3 μm to about 20 μm and a length of about 10 μm to about 100 μm; a finger of the second electrode pattern having a width of about 3 μm to about 20 μm and a length of about 10 μm to about 100 μm; and a distance between a finger of the first electrode pattern and an adjacent finger of the second electrode pattern being about 3 μm to about 20 μm.

Optionally, a distance between a top of a finger of the first electrode pattern and a closest finger of the second electrode pattern is about 3 μm.

Optionally, the driving transistor includes a gate pattern on the substrate, the gate pattern and the light-blocking pattern being formed through a same fabrication step and being made of a same material.

Optionally, a gate insulating layer is on the gate pattern and the light-blocking pattern; and the active layer pattern of the driving transistor is on the gate insulating layer to correspond to the gate pattern.

Optionally, the array substrate includes more than two UV detection structures arranged in an array and connected in parallel, where a total electric current of the UV detection structures is an output electric current of the array.

Another aspect of the present disclosure provides a display apparatus. The display apparatus includes one or more of the disclosed array substrates.

Optionally, the display apparatus further includes a bias output, connected to the first electrode pattern and the second electrode pattern of the at least one UV detection structure to provide the operating voltage for the at least one UV detection structure. The display apparatus also includes a current detector, connected to the first electrode pattern or the second electrode pattern of the at least one UV detection structure to detect an output electric current of the at least one UV detection structure.

Optionally, the display apparatus further includes an obtaining circuitry, connected to the current detector and configured to calculate an intensity of UV light.

Optionally, a processor controls the obtaining circuitry to obtain the intensity of the UV light based on a mapping between electric current values and light intensity values.

Optionally, the display apparatus further includes an encapsulation substrate, where an area on the encapsulation substrate corresponding to the at least one UV detection structure is hollow or substantially transparent to UV light.

Another aspect of the present disclosure provides a method for fabricating an array substrate. The method includes forming a photosensitive pattern of at least one ultraviolet (UV) detection structure, forming a first electrode pattern and a second electrode pattern of a UV detection structure for providing an operating voltage for the at least one UV detection structure.

Optionally, the method further includes providing a substrate with a gate insulating layer; forming an active layer pattern of a driving transistor and a photosensitive pattern of a ultraviolet (UV) detection structure on the gate insulating layer, the active layer pattern being formed in a display region on the substrate and the photosensitive pattern being formed in a peripheral region on the substrate; and forming a source pattern and a drain pattern of the driving transistor on the active layer pattern and forming a first electrode pattern and a second electrode pattern of the UV detection structure on the photosensitive pattern.

Optionally, the photosensitive pattern of the UV detection structure and the active layer pattern of the driving transistor are formed in a same fabrication step and are made of a same material.

Optionally, the source pattern and the drain pattern of the driving transistor and the first electrode pattern and the second electrode pattern of the UV detection structure are formed in a same fabrication step and are made of a same material.

Optionally, the method further includes forming a gate pattern in the display region before forming the active layer pattern and the photosensitive pattern, the active layer pattern corresponding to the gate pattern; and forming a light-blocking pattern on the substrate in a same fabrication step as that of forming the gate pattern, an orthogonal projection of the light-blocking pattern on the substrate fully enclosing an orthogonal projection of the photosensitive pattern on the substrate.

Optionally, the photosensitive pattern is positioned above the light-blocking pattern.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

Embodiment One

Figure 1:
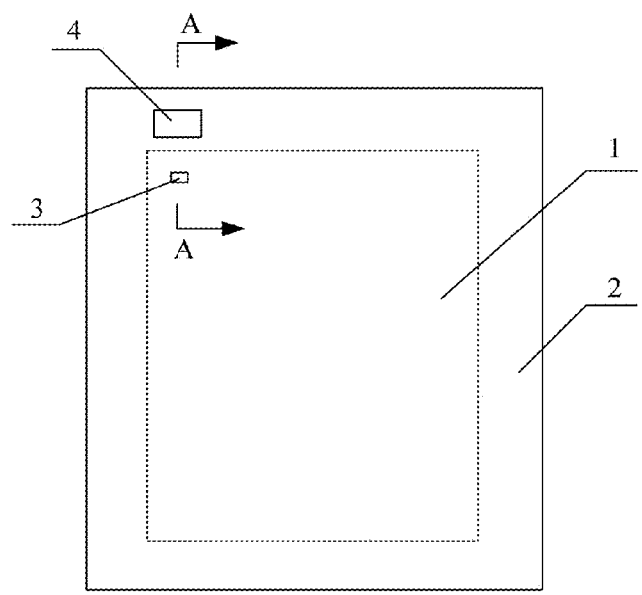
FIG. 1 illustrates the top view of an exemplary array substrate according to embodiment one of the present disclosure.
Figure 2:
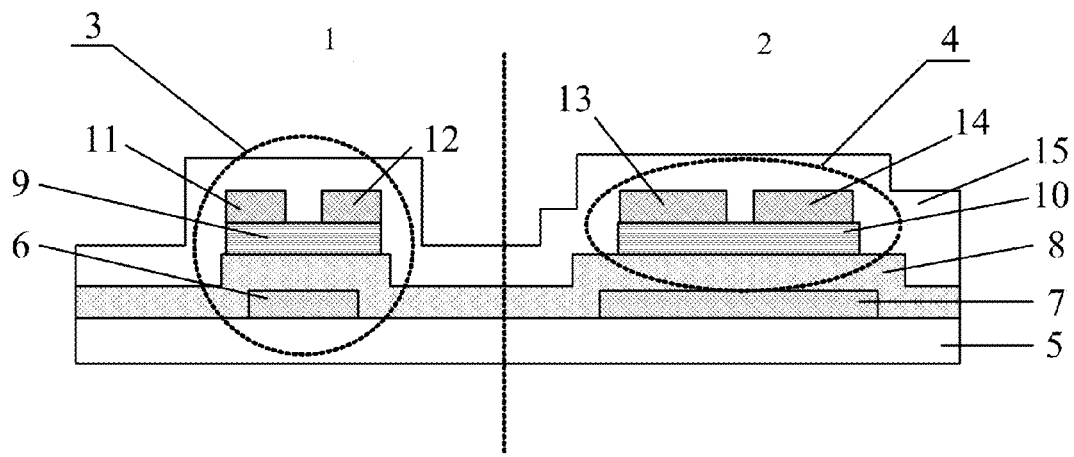
FIG. 2 illustrates the cross-sectional view of the array substrate shown in FIG. 1 along the A-A direction.

Embodiments of the present disclosure provide an array substrate. FIG. 1 illustrates a top view of an exemplary array substrate provided by the present disclosure. FIG. 2 illustrates the cross-sectional view of the array substrate shown in FIG. 1. As shown in FIGS. 1 and 2, the array substrate may include a substrate 5 and at least one UV detection structure 4 formed on the substrate 5. For illustrative purposes, only one UV detection structure 4 is shown in FIG. 1. The UV detection structure 4 may include a photosensitive pattern 10. The UV detection structure 4 may also include a first electrode pattern 13 and a second electrode pattern 14 formed on the photosensitive pattern 10. When UV light is radiating on the UV detection structure 4, the UV detection structure 4 may detect or measure the intensity of UV light or UV radiation. The array substrate may include an active area 1 and a peripheral region 2. The active area 1 may be the region used for displaying images and may be referred as the display region of the array substrate. The peripheral region 2 is not used for displaying images and may be referred as the non-display region of the array substrate.

The working principle of the UV detection structure 4 may be described as follows. The photosensitive pattern 10 may receive or absorb UV light of different intensities and the conductivity of the photosensitive pattern 10 may change accordingly. That is, a certain light intensity may correspond to a certain conductivity of the photosensitive pattern 10 and different intensities of UV light may each correspond to a different conductivity of the photosensitive pattern 10. By applying a predetermined bias on the first electrode pattern 13 and the second electrode pattern 14, and further measuring the current flowing through the first electrode pattern 13 and the second electrode pattern 14, the output current of the UV detection structure 4 may be obtained. Based on the obtained output current of the UV detection structure 4, the intensity of the UV light can be determined by looking up a mapping between current and light intensity values. The voltage difference between the bias applied on the first electrode pattern 13 and the bias applied on the second electrode pattern 14 may be the operating bias of the UV detection structure 4. The current flowing through the first electrode pattern 13 and the second electrode pattern 14 may represent the output current of the UV detection structure 4.

The relationship between the output current and light intensities may be stored in a predetermined table containing the mapping between current and light intensity values. For example, a certain current may correspond to a certain light intensity and different current may each correspond to a different light intensity. The predetermined mapping table may be obtained from experiments performed on the UV detection structure 4, in advance, to determine the relationship between current and light intensity values. For example, when a predetermined bias is applied on the UV detection structure 4, the output current of the UV detection structure 4 and the corresponding light intensity may be measured and stored in the table.

However, in practice, because the output current of a single UV detection structure 4 may be considerably small and therefore hard to measure. The detection accuracy may be low. To solve this problem, a plurality of UV detection structures 4 may be formed on the substrate 5. The plurality of UV detection structures 4 may form a UV detection array. In the UV detection array, the plurality of UV detection structures 4 may be connected in parallel. Specifically, conductive wires corresponding to the UV detection structures 4, e.g., metal wires, may be arranged in a way so that the first electrode patterns 13 of the UV detection structures 4 may be electrically connected, and the second electrode patterns 14 of the UV detection structures 4 may be electrically connected. By measuring or detecting the total output current of the plurality of UV detection structures 4, the output current of the UV detection array may be obtained. Further, based on the output current of the UV detection array and the predetermined mapping between current and light intensity values, the intensity of the UV light may be determined.

The mapping between current and light intensity values may be stored in a predetermined table containing the relationship between current and light intensity values, e.g., a certain current may correspond to a certain light intensity and different current may each correspond to a different light intensity. The predetermined mapping table may be obtained from experiments performed on the UV detection array for determining the relationship between currents and the light intensities. The mapping between current and light intensity values may be determined by applying predetermined voltages on the UV detection array.

FIG. 2 illustrates the cross-sectional view along the A-A direction of a driving transistor 3 and a UV detection structure 4. The driving transistor 3 may be located in the active area 1 and the UV detection structure 4 may be located in the peripheral region 4. The dashed line rectangle in FIG. 1 and the dashed line in FIG. 2 may only be used for illustrative purposes to distinguish the active area 1 and the peripheral region 2, and may not exist in practice. The UV detection structures 4 may be fabricated directly on the array substrate. That is, in embodiments of the present disclosure, the process of fixing or mounting the UV detection structures 4 onto a display apparatus is not necessary. Thus, the display apparatus may be less susceptible to damages incurred during the mounting process.

In some embodiments, the array substrate may further include a plurality of driving transistors 3 formed on the substrate. The driving transistors 3 may be used to drive the pixel units to display images. The photosensitive pattern 10 may be arranged on the same layer with the active layer pattern 9 in the driving transistor 3, and/or the first electrode pattern 13 and the second electrode pattern 14 may be arranged on the same layer with the source pattern 11 and the drain pattern 12 in the driving transistors 3.

When the photosensitive pattern 10 is arranged in the same layer as the active layer pattern 9 of the driving transistor 3, the photosensitive pattern 10 and the active layer pattern 9 may be fabricated through one step of the patterning process. When the first electrode pattern 13 and the second electrode pattern 14 are arranged in the same layer as the source pattern 11 and the drain pattern 12, the first electrode pattern 13, the second electrode pattern 14, the source pattern 11, and the drain pattern 12 may be fabricated through one step of the patterning process. Thus, by using the fabrication process for an existing array substrate, the driving transistor 3 and the UV detection structure 4 may be formed through the same fabrication steps. Compared to fabricating UV detection structures 4 and the array substrate separately and/or independently, the technical solution provided by the present disclosure may effectively reduce the fabrication steps. In one embodiment, considering the driving functions of the driving transistor 3 and the photo-detecting functions of the photosensitive pattern 10, the active layer pattern 9 and the photosensitive pattern 10 may both be made of semiconductor materials with wide bandgaps. For example, the semiconductor materials may be zinc oxide and/or indium gallium zinc oxide. In some certain embodiments, the active layer pattern 9, in the active area, may be made of a normal light-emitting material. That is, the materials to form the active layer pattern 9 and the photosensitive pattern 10 may be the same or may be different.

It should be noted that, in one embodiment, the driving transistors 3 may be located in the active area 1 of the array substrate, and the UV detection structures 4 may be located in the peripheral region 2. Thus, without impairing the normal display of the display apparatus, the intensity of the UV light can be detected or measured. However, in practice, when in operation, the light generated by the backlight source of the display apparatus may penetrate the substrate 5 and illuminate on the photosensitive pattern 10 in the UV detection structure 4. The detection or measurement accuracy of the UV detection structure 4 may be adversely affected.

To solve the technical problems described above, in some embodiments, the array substrate may further include a light-blocking pattern 7. The light-blocking pattern 7 may be arranged in the same layer as the gate pattern 6 in the driving transistor 3. The orthogonal projection of the photosensitive pattern 10 on the substrate 5 may be fully enclosed by the orthogonal projection of the light-blocking pattern 7 on the substrate 5. The light generated by the backlight source may be blocked by the light-blocking pattern 7 and may not transmit to the photosensitive pattern 10. The UV detection structure 4 may be less susceptible to the light interference by the backlight source.

It should be noted that, because the light-blocking pattern 7 and the gate pattern 6 in the driving transistor 3 may be arranged in the same layer, the light-blocking pattern 7 and the gate pattern 6 may be formed through the same step of the patterning process. That is, adding the light-blocking pattern 7 may not require adding additional fabrication steps to the fabrication process of the array substrate.

Further, it should be noted that, the arrangement or order of the layers in a UV detection structure is not limited by the disclosed embodiments. After the gate pattern 6 is formed, a gate insulating layer 8 may be formed on the gate pattern 6. In one embodiment, the gate insulating layer 8 may cover the light-blocking pattern 7. In one embodiment, the photosensitive pattern 10 may be formed on the first electrode pattern 13 and the second electrode pattern 14. That is, the order of the first electrode pattern 13, the second electrode pattern 14, and the photosensitive pattern 10 may be changed. For example, the first electrode pattern 13 and the second electrode pattern 14 may be formed before the formation of the photosensitive pattern 10. In this case, the source pattern 11 and the drain pattern 12 may be formed before the formation of the active layer pattern 9. That is, the active layer pattern 9 may still be formed through the same step with the photosensitive pattern 10. The source pattern 11 and the drain pattern 12 may still be formed through the same step with the first electrode pattern 13 and the second electrode pattern 14. The functions of the UV detection structure 4 and the driving transistor 3 would not be affected by the changes in the order of layers. It is only required that the operating voltage for the UV detection structures can be provided. The formation processes of the first electrode pattern, the second electrode pattern 14, and the photosensitive pattern 10 will be described below.

In some embodiments, a passivation layer 15 may be formed on the driving transistor 3 and the UV detection structure 4. The passivation layer 15 may be used to encapsulate and/or protect the driving transistor 3 and the UV detection structure 4.

Figure 3:
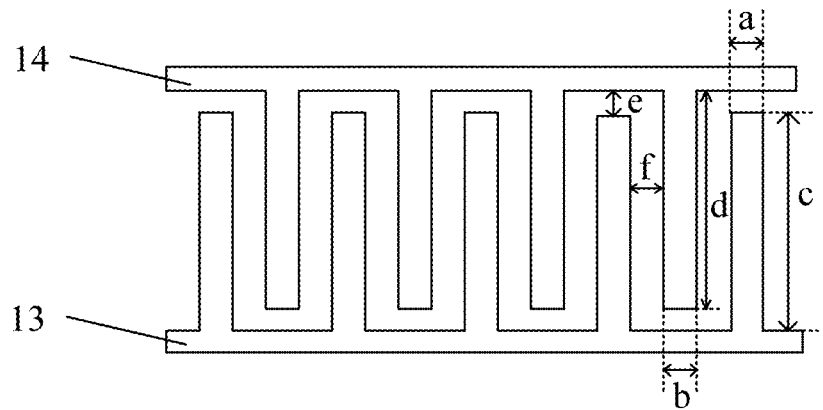
FIG. 3 illustrates the structures of an exemplary first electrode pattern and an exemplary second electrode pattern according to embodiment one of the present disclosure.

FIG. 3 illustrates the structures of the first electrode pattern 13 and the second electrode pattern 14. As shown in FIG. 3, as an alternative of embodiment one, the first electrode pattern 13 and the second electrode pattern 14 may have a staggered-fingers shape. The fingers of the first electrode pattern 13 and the fingers of the second electrode pattern 14 may be arranged in an alternating manner. For example, one finger of the first electrode pattern 13 may be arranged between two fingers of the second electrode pattern 14, and vice versa. Optionally, a finger of the first electrode pattern 13 may have a width of about 3 µm to about 20 µm. A finger of the second electrode pattern 14 may have a width b of about 3 µm to about 20 µm. A finger of the first electrode pattern 13 may have a length c of about 10 µm to about 100 µm. A finger of the second electrode pattern 14 may have a length d of about 10 µm to about 100 µm. A distance f between a finger of the first electrode pattern 13 and a finger of the second electrode pattern 14 may be about 3 µm to about 20 µm.

It should be noted that, the detection accuracy of the array substrate may be improved if the first electrode pattern 13 and the second electrode pattern 14 have more fingers, fingers with increased lengths, and/or a shorter distance between two fingers. Based on the specifications of the fabrication process, the shortest distance between two adjacent fingers, i.e., one finger of the first electrode pattern 13 and one finger of the second electrode pattern 14, may be about 3 µm. Meanwhile, to ensure the first electrode pattern 13 and the second electrode pattern 14 each has a sufficient number of fingers, the width of a finger should be the smallest, which is about 3 µm. In addition, although longer fingers may enable a higher detection accuracy of the UV detection structure 4, the area of the UV detection structure 4 may be increased, which can adversely affect the implementation of a narrow bezel display apparatus. Thus, considering both the detection accuracy and the area of the UV detection structure 4, in some embodiments, the length of a finger of the first electrode pattern 13 or the second electrode pattern 14 may be about 30 µm. It should be noted that, the length of a finger should be adjusted according to different applications or designs and should not be limited by the embodiments herein.

Based on the working principle described above, in another embodiment of the present disclosure, the width of a finger of the first electrode pattern 13 may be about 3 µm. The width b of a finger of the second electrode pattern 14 may be about 3 µm. The length c of a finger of the first electrode pattern 13 may be about 30 µm. The length d of a finger of the first electrode pattern 14 may be about 30 µm. The distance f between a finger of the first electrode pattern 13 and a finger of the second electrode pattern 14 may be about 3 µm. A distance e between the top of a finger of the first electrode 13 and the closest second electrode pattern 14 may be about 3 µm.

It should be noted that, the disclosed arrangements of the first electrode pattern 13 and the second electrode pattern 14 may only be exemplary and may only represent all embodiments of the present disclosure. The arrangements described above may only represent the arrangement for obtaining high detection accuracy using the UV detection structure 4 using existing fabrication process. As the fabrication technology advances, the width of a finger and the distance between two adjacent fingers may be smaller than 3 µm. It is known to those skilled in the art that, the arrangements described above should not limit the scope of the present disclosure. In some embodiments of the present disclosure, the first electrode pattern 13 and the second electrode pattern 14 may also have other structures or shapes.

Embodiment Two

Embodiments of the present disclosure provide a method for fabricating an array substrate. The method may be used to fabricate the array substrate described in embodiment one. According to the method, at least one UV detection structure may be formed on the substrate. The UV detection structure may include a photosensitive pattern. The UV detection structure may also include a first electrode pattern and a second electrode pattern formed on the photosensitive pattern.

In one embodiment, as shown in FIGS. 1 and 2, the at least one UV detection structure 4 may be fabricated directly on the array substrate so that no additional fixing or mounting process is required to place the at least one UV detection structure 4 onto the display apparatus. The display apparatus may be less susceptible to damages that may incur during the mounting process.

Embodiment Three

Figure 4:
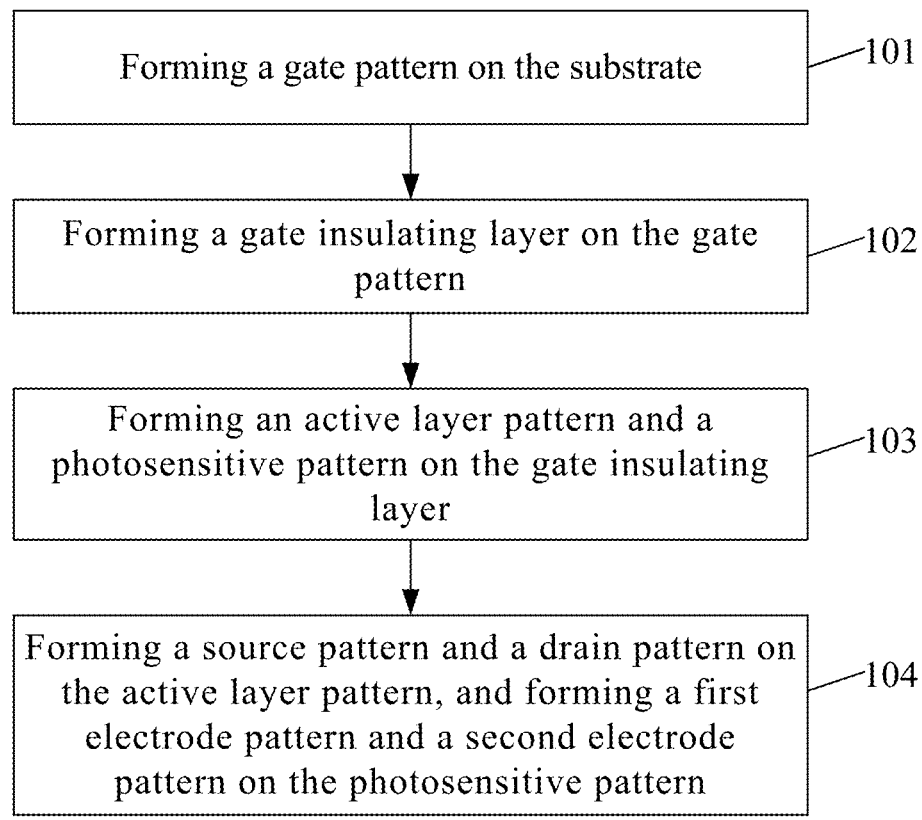
FIG. 4 illustrates an exemplary process flow of the method for fabricating an array substrate according to embodiment three of the present disclosure.

FIG. 4 illustrates an exemplary process flow of the method for fabricating the array substrate provided by embodiment one. The method may include steps S101 to S104.

In step S101, a gate pattern is formed on the substrate.

As shown in FIGS. 2 and 4, in step S101, a thin gate film may be formed on the substrate. The thin gate film may be patterned to form the gate pattern. The thin gate film may be made of any suitable material such as polysilicon and/or metal. The thin gate film may be formed by any suitable deposition method such as sputtering.

It should be noted that, the patterning process to pattern the thin gate film may be any suitable patterning process. For example, the patterning process may include a photolithography process, an exposure process, a development process, an etch process, and/or a photoresist stripping process.

In step S102, a gate insulating layer is formed on the gate pattern.

As shown in FIGS. 2 and 4, a gate insulating layer may be formed on the gate pattern. The gate insulating layer may be formed by any suitable deposition method such as plasma enhanced chemical vapor deposition (PECVD).

In step S103, an active layer pattern and a photosensitive pattern are formed on the gate insulating layer.

As shown in FIGS. 2 and 4, an active layer pattern and a photosensitive pattern may be formed on the gate insulating layer. An active layer and a photosensitive layer may be formed simultaneously or in the same fabrication step on the gate insulating layer. A same patterning process may be used to form the active layer pattern and the photosensitive pattern. The patterning process may include a photolithography process and a suitable follow-up etching process. The active layer pattern may be formed on the gate insulating layer within the active area, i.e., display region, of the array substrate. The photosensitive pattern may be formed on the gate insulating layer within the peripheral region, i.e., non-display region, of the array substrate. The photosensitive pattern may be made of a suitable semiconductor material with a wide bandgap. The active layer pattern may be made of a same material as the photosensitive pattern or a different material than the photosensitive pattern. For example, the active layer pattern may be made of a semiconductor material with a wide bandgap or made of a normal light-emitting material.

In one embodiment, the semiconductor material may be zinc oxide and/or indium gallium zinc oxide.

In step S104, a source pattern and a drain pattern are formed on the active layer pattern, and a first electrode pattern and a second electrode pattern are formed on the photosensitive pattern.

The first electrode pattern, the second electrode pattern, the source pattern, and the drain pattern may be fabricated through one step of the patterning process. As shown in FIGS. 2 and 4, a metal thin film may be formed through the same fabrication or deposition step on the active layer pattern and the photosensitive pattern. A patterning process may be used to form the source pattern, the drain pattern, the first electrode pattern, and the second electrode pattern. The source pattern and the drain pattern may be formed on the active layer pattern. The first electrode pattern and the second electrode pattern may be formed on the photosensitive pattern. The patterning process may include a photolithography process and a suitable follow-up etching process.

As shown in FIG. 2, the gate pattern, the source pattern, the active layer pattern, and the drain pattern may form a driving transistor. The photosensitive pattern, the first electrode pattern, and the second electrode pattern may form a UV detection structure.

Embodiment Four

Figure 5:
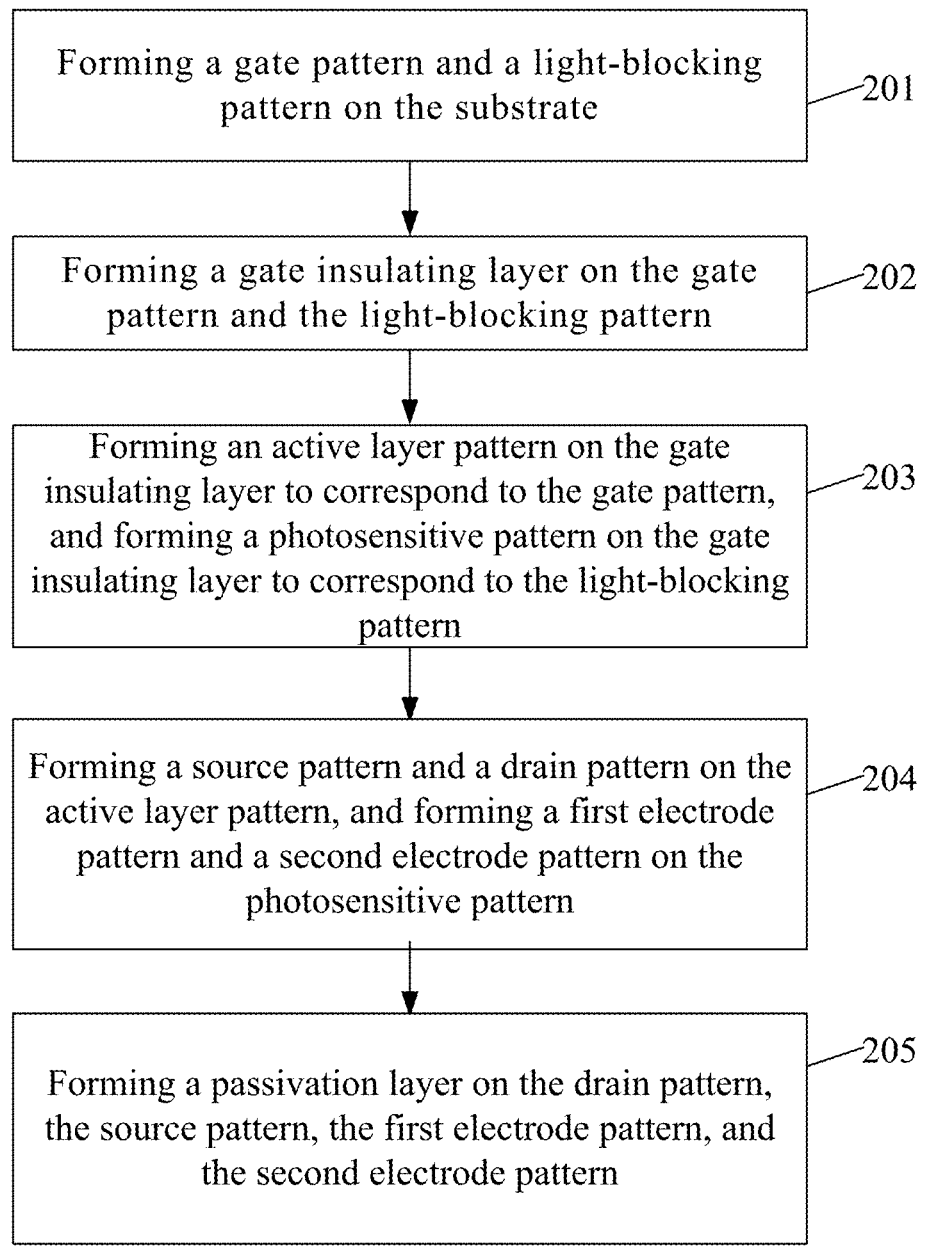
FIG. 5 illustrates an exemplary process flow of the method for fabricating an array substrate according to embodiment four of the present disclosure.

FIG. 5 illustrates an exemplary process flow of the method for fabricating the array substrate provided by embodiment four. The method may include steps S201 to S205.

In step S201, a gate pattern and a light-blocking pattern are formed on the substrate.

Figure 6:
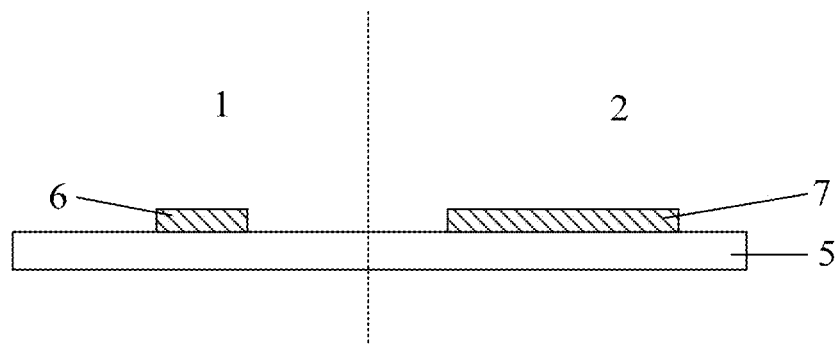
FIGS. 6 to 9 illustrate the cross-sectional view of an array substrate in different stages of an exemplary fabrication process according to the embodiments of the present disclosure.

FIG. 6 illustrates the cross-sectional view of the gate pattern 6 and the light-blocking pattern 7. The gate pattern 6 and a light-blocking pattern 7 are formed on the substrate 5 through a same fabrication step. As shown in FIGS. 5 and 6, a first thin film may be formed on the substrate 5. A patterning process may be used to pattern the first thin film to form the gate pattern 6 and the light-blocking pattern 7. The first thin film may be made of any suitable materials such as polysilicon and/or metal. The gate pattern 6 may be located in the active area 1 of the array substrate, and the light-blocking pattern 7 may be located in the peripheral region 2 of the array substrate. For illustrative purposes, the active area 1 and the peripheral region 2 may be distinguished using a dashed line in FIGS. 6 to 8. The parts shown in the Figures of this disclosure do not reflect the actual dimensions and/or ratios of the structures.

In step S202, a gate insulating layer is formed on the gate pattern and the light-blocking pattern.

Figure 7:
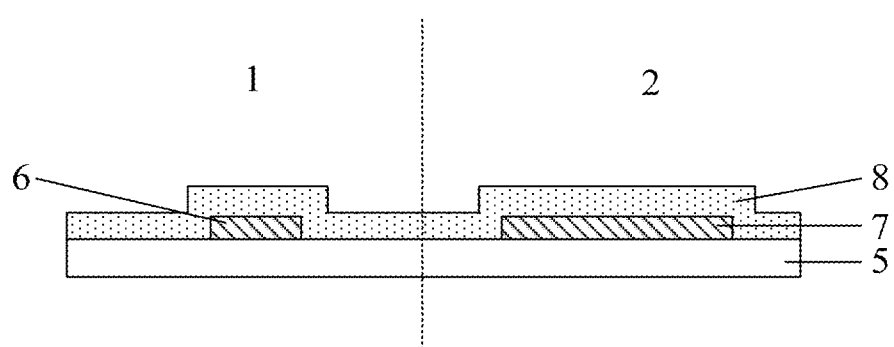

FIG. 7 illustrates the cross-sectional view of the gate insulating layer 8. The gate insulating layer 8 may be formed on the gate pattern 6 and the light-blocking pattern 7. The gate insulating layer 8 may be made of any suitable insulating material such as $SiO_2$ and/or SiN. The gate insulating layer 8 may be formed by any suitable deposition process such as PECVD. In one embodiment, the gate insulating layer 8 may cover the gate pattern 6 and the light-blocking pattern 7.

In step S203, an active layer pattern is formed on the gate insulating layer to correspond to the gate pattern, and a photosensitive pattern is formed on the gate insulating layer to correspond to the light-blocking pattern.

Figure 8:
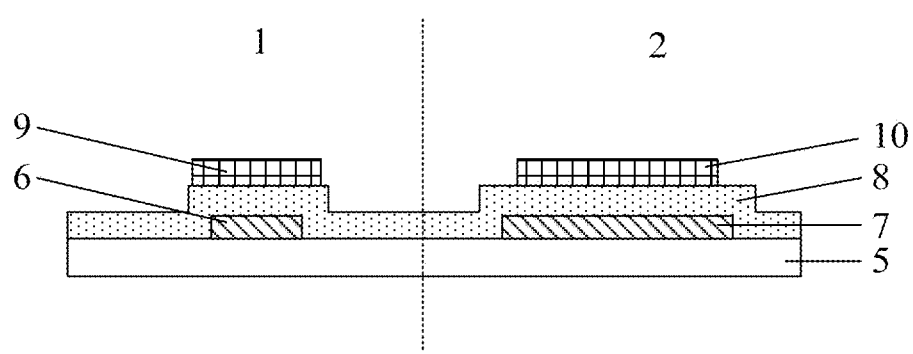

FIG. 8 illustrates the cross-sectional view of the active layer pattern 9 and the photosensitive pattern 10. An active layer and a photosensitive layer may be formed simultaneously or in the same step on the gate insulating layer. A same patterning process may be used to form the active layer pattern 9 and the photosensitive pattern 10. The patterning process may include a photolithography process and a suitable follow-up etching process. The active layer pattern 9 may be formed on the gate insulating layer within the active area 1 of the array substrate. The photosensitive pattern 10 may be formed on the gate insulating layer within the peripheral region 2 of the array substrate. The photosensitive pattern 10 may be made of a suitable semiconductor material with a wide bandgap. The location of the active layer pattern 9 may correspond to the position of the gate pattern 6, and the location of the photosensitive pattern 10 may correspond to the position of the light-blocking pattern 7. In one embodiment, the active layer pattern 9 may be formed above the gate pattern 6, separated by the gate insulating layer 8 from the gate pattern 6. The photosensitive pattern 10 may be formed above the light-blocking pattern 7, separated by the gate insulating layer 8 from the gate pattern 6. The orthogonal projection of the photosensitive pattern 10 on the substrate 5 may be fully enclosed by the orthogonal projection of the light-blocking pattern 7 on the substrate 5.

In step S204, a source pattern and a drain pattern are formed on the active layer pattern. A first electrode pattern and a second electrode pattern are formed on the photosensitive pattern.

Figure 9:
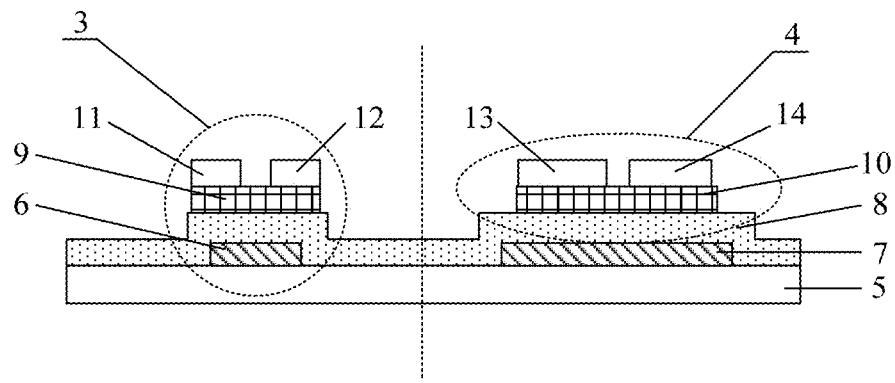

FIG. 9 illustrates the cross-sectional view of the source pattern 11, the drain pattern 12, the first electrode pattern 13, and the second electrode pattern 14. As shown in FIGS. 2 and 9, a metal thin film may be formed through the same deposition step on the active layer pattern 9 and the photosensitive pattern 10. A patterning process may be used to form the source pattern 11, the drain pattern 12, the first electrode pattern 13, and the second electrode pattern 14. The source pattern 11 and the drain pattern 12 may be formed on the active layer pattern 9. The first electrode pattern 13 and the second electrode pattern 14 may be formed on the photosensitive pattern 14. The patterning process may include a photolithography process and a suitable follow-up etching process.

In step S205, a passivation layer is formed on the drain pattern, the source pattern, the first electrode pattern, and the second electrode pattern.

As shown in FIG. 2, a passivation layer 15 may be formed on the drain pattern 12, the source pattern 11, the first electrode pattern 13, and the second electrode pattern 14. The passivation layer 15 may be formed by any suitable deposition method such as PECVD. The passivation layer 15 may be made of any suitable insulating material such as $SiO_2$ and/or SiN. The gate pattern 6, the source pattern 11, the active layer pattern 9, and the drain pattern 12 may form a driving transistor 3. The photosensitive pattern 10, the first electrode pattern 13, and the second electrode pattern 14 may form a UV detection structure 4. The passivation layer 15 may protect and/or encapsulate the driving transistor 3 and the UV detection structure 4.

As shown in embodiments three and four, by using the technical solution provided by the present disclosure, the fabrication of the UV detection structures may be incorporated or contained in the fabrication of an existing array substrate. The UV detection structures and the driving transistors may be formed in the same fabrication steps without adding additional fabrication steps to the existing fabrication process.

Embodiment Five

Embodiments of the present disclosure provide a display apparatus. The display apparatus may include an encapsulation substrate and an array substrate. The array substrate may be the array substrate disclosed in any one of the embodiments of the present disclosure. The structure and the fabrication process of the array substrate may be referred to embodiments one to four and are not repeated herein.

It should be noted that, the display apparatus may incorporate one or more of the array substrates described in the disclosed embodiments. The display apparatus according to the embodiments of the present disclosure can be used in any product with display functions such as a television, an electronic paper, a digital photo frame, a mobile phone, a tablet computer, and a navigation device.

In one embodiment, to ensure light coming from the outside environment can illuminate on the UV detection structure on the array substrate areas corresponding to the UV detection structures, a hollow structure or a structure having substantial transparency to at least UV light may be used on the surface of the display panel. For example, the brand label of the display apparatus is often arranged in the peripheral region of the display apparatus. Thus, the brand label may be implemented to be hollow or to have substantial transparency, and the UV detection structures may be arranged to correspond to the area containing the brand label. The peripheral region of the display apparatus may thus be reduced for the realization of narrow bezel display apparatus.

Figure 10:
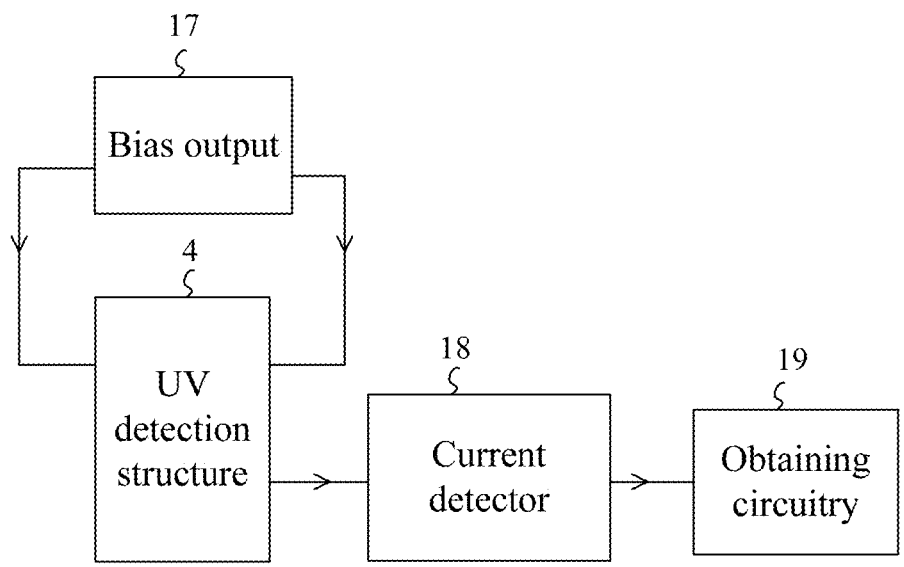
FIG. 10 illustrates an exemplary block diagram of the display apparatus according to the embodiments of the present disclosure.

FIG. 10 illustrates an exemplary block diagram of the display apparatus. As shown in FIG. 10, the display apparatus may include a bias output 17, a current detector 18, an obtaining circuitry 19, and a UV detection structure 4. FIG. 10 illustrates an exemplary connection relationship and signal transfers in the display apparatus. The bias output 17 may be connected to the first electrode pattern and the second electrode pattern of the UV detection structure 4. The current detector 18 may be connected to the first electrode pattern or the second electrode pattern of the UV detection structure 4. The obtaining circuitry 19 may be connected to the current detector 18.

The bias output 17 may be used to output electrical signals to the first electrode pattern and the second electrode pattern so that the voltage applied on the first electrode pattern and the voltage applied on the second electrode pattern may have a voltage difference equal to a predetermined voltage value. The predetermined voltage value may be the operating voltage of the UV detection structure 4. The current detector 18 may be used to detect or measure the intensity of the current flowing through the first electrode pattern and the second electrode pattern. The electric current flowing through the first electrode pattern and the second electrode pattern may be the same. The electric current detected by the current detector 18 may be the output current of the UV detection structure 4. The obtaining circuitry 19 may be used to calculate the intensity of the UV radiation or UV light based on the predetermined voltage value, the output current of the UV detection structure 4, and the mapping between current and light intensity values. The mapping between the current and light intensity values may be obtained and recorded from experiments performed in advance.

The bias output 17 may include any suitable resistors and/or capacitors for outputting voltages from a suitable voltage source and providing a potential difference between the first electrode pattern and the second electrode pattern. The current detector 18 may include a suitable ammeter or the like to measure the intensity of the electric current. The obtaining circuitry 19 may include suitable circuits connected to the current detector 18 for obtaining the current value. The obtaining circuitry 19 may also include computer programs that are executable by a processor, e.g., a driving chip of the array substrate. That is, the obtaining circuitry 19 may be controlled by a processor or a driving chip to calculate the light intensity values of the detected UV light. In one embodiment, the computer programs may be executed to store a mapping of current values and light intensities, read the obtained current value, determine the light intensity based on the obtained current value, and output the determined light intensity.

Figure 11:
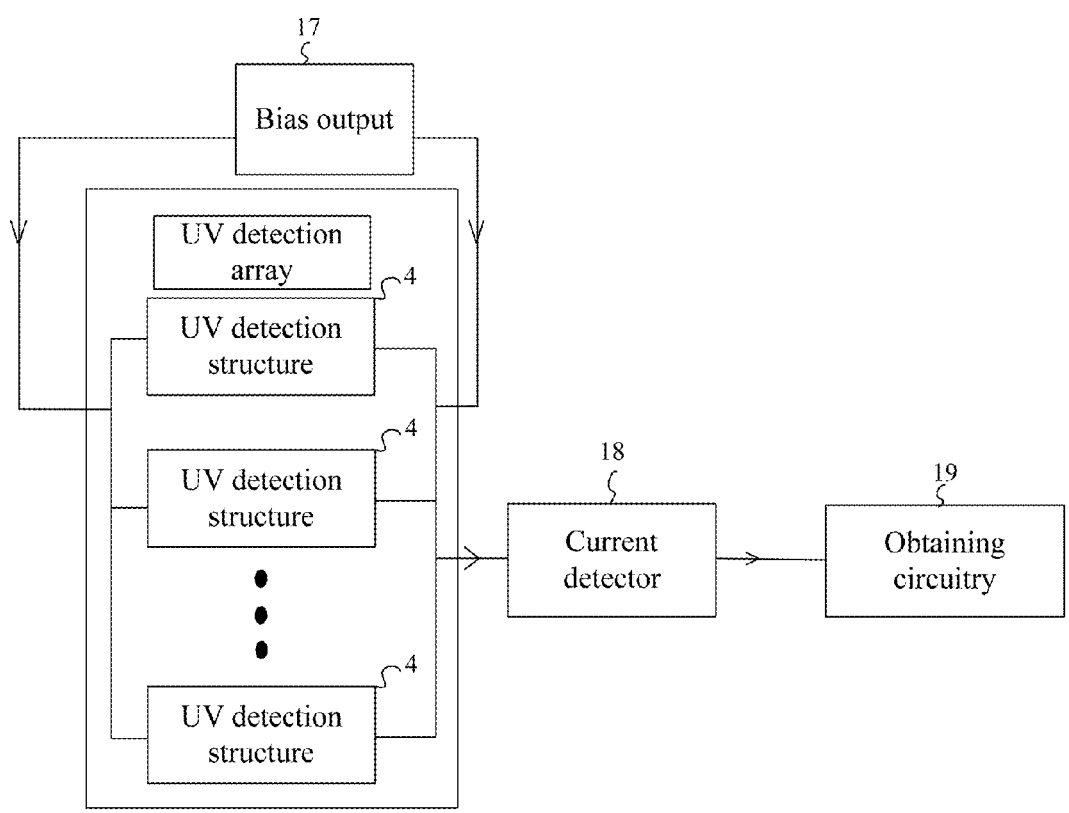
FIG. 11 illustrates another exemplary block diagram of the display apparatus according to the embodiments of the present disclosure.

FIG. 11 illustrates another exemplary block diagram of the display apparatus. The display apparatus may include a plurality of UV detection structures 4. For example, the number of UV detection structures 4 may be at least two. The display apparatus may also include a bias output 17, a current detector 18, and an obtaining circuitry 19. FIG. 11 illustrates the connection relationship and signal transfers in the display apparatus. The plurality of UV detection structures 4, arranged in the UV detection array, may be arranged in a UV detection array, i.e., an array of UV detection structures 4. The UV detection array is illustrated using a box with a plurality of UV detection structures 4 within in FIG. 11. The UV detection structures 4 may be connected in parallel. Specifically, by arranging corresponding conductive wires, such as metal wires, the first electrode patterns of the UV detection structures 4 may be electrically connected, and the second electrode patterns of the UV detection structures 4 may be electrically connected. By measuring or detecting the total output electrical current of the UV detection structures 4, the output current of the UV detection array may be obtained. The obtaining circuitry 19 may be used to calculate the intensity of the UV radiation or UV light based on the predetermined voltage value, the output current of the UV detection array, and the mapping between current and light intensity values. The mapping between current and light intensity values may be obtained or recorded from experiments performed in advance.

It should be noted that, operations of the display apparatus incorporating the bias output 17, the current detector 18, the obtaining circuitry 19, and the UV detection structures 4 to obtain the intensity of UV radiation are discussed in the descriptions of embodiment one and are not repeated herein.

Figure 12:
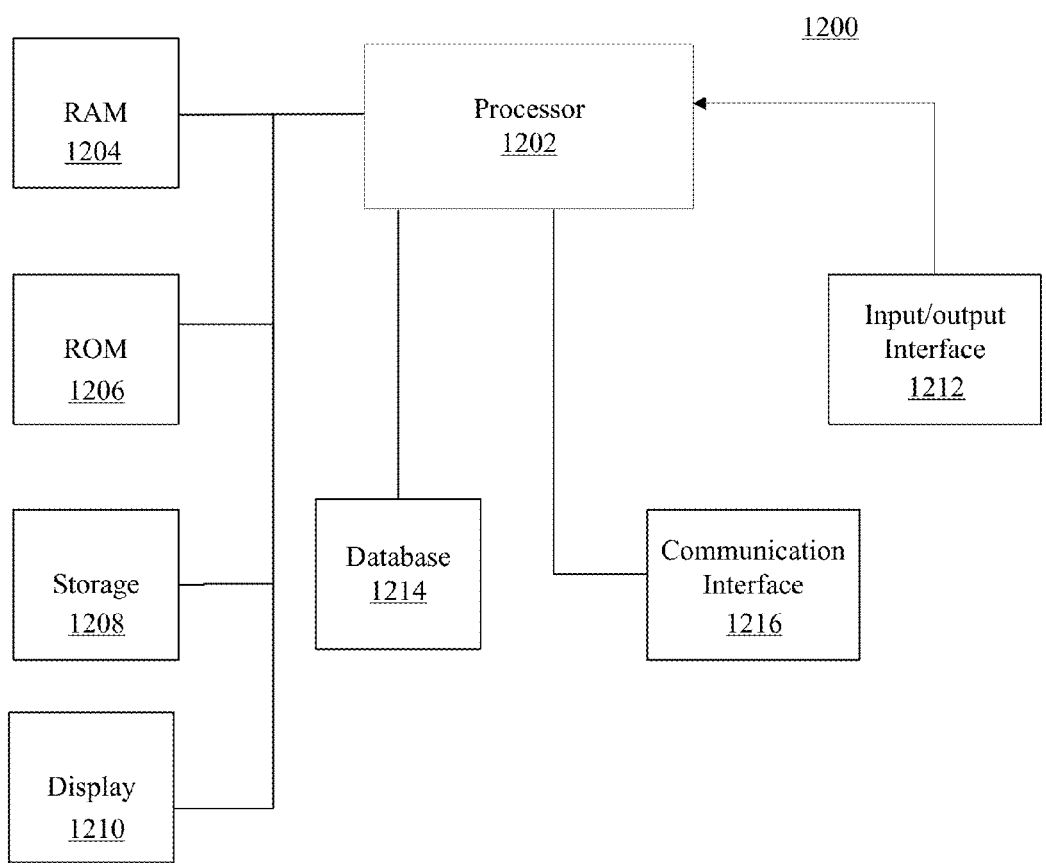
FIG. 12 illustrates an exemplary block diagram of a driving chip.

In one embodiment, the bias output 17, the current detector 18, and the obtaining circuitry 19 may be integrated in a driving chip of the display apparatus. The integration level of the display apparatus may be improved. FIG. 12 illustrates the block diagram of an exemplary driving chip 1200.

The driving chip 1200 may accept, process, and execute commands from the display apparatus. The driving chip 1200 may include any appropriately configured computer system. As shown in FIG. 12, system 1200 may include a processor 1202, a random access memory (RAM) 1204, a read-only memory (ROM) 1206, a storage 1208, a display 1210, an input/output interface 1212, a database 1214; and a communication interface 1216. Other components may be added and certain devices may be removed without departing from the principles of the disclosed embodiments.

Processor 1202 may include any appropriate type of general purpose microprocessor, digital signal processor or microcontroller, and application specific integrated circuit (ASIC). Processor 1202 may execute sequences of computer program instructions to perform various functions associated with the driving chip 1200. Computer program instructions may be loaded into RAM 1204 for execution by processor 1202 from ROM 1206, or from storage 1208. Storage 1208 may include any appropriate type of mass storage provided to store any type of information that processor 1202 may need to perform the processes. For example, storage 1208 may include one or more hard disk devices, optical disk devices, flash disks, or other storage devices that provide storage space.

Display 1210 may provide information to a user or users of the driving chip 1200. Display 1210 may include any appropriate type of computer display device or electronic device display (e.g., CRT or LCD based devices). Input/output interface 1212 may be provided for users to input information into the driving chip 1200 or for the users to receive information from the driving chip 1200. For example, input/output interface 1212 may include any appropriate input device, such as a keyboard, a mouse, an electronic tablet, voice communication devices, or any other optical or wireless input devices. Further, input/output interface 1212 may receive from and/or send to other external devices.

Further, database 1214 may include any type of commercial or customized database, and may also include analysis tools for analyzing the information in the databases. Database 1214 may be used for storing information for semiconductor manufacturing and other related information. Communication interface 1216 may provide communication connections such that driving chip 1200 may be accessed remotely and/or communicate with other systems through computer networks or other communication networks via various communication protocols, such as transmission control protocol/internet protocol (TCP/IP), hyper text transfer protocol (HTTP), etc.

In one embodiment, a user may control the driving chip 1200 to output electric signals to the first electrode pattern and the second electrode pattern for the UV detection structures 4 to be operated under a predetermined operating voltage. The processor 1202 may accept, process, and execute the commands to obtain data from the UV detection structures 4. The communication interface can communicate with self-monitoring device to collect and process data obtained from the UV detection structures 4. Suitable data may be stored in ROM 1206 and storage 1208 to be processed. The processor 1202 may also obtain the collected data and determine the intensity of the UV light according to a mapping process. After the data is processed, result of the self-monitoring can be obtained. The result can be returned to the user via the display 1210 or the input/output interface 1212.

In some embodiments, the bias output 17, the current detector 18, and the obtaining circuitry 19 may be connected to and controlled by the driving chip 1200. The driving chip 1200 may control the bias output 17 to output voltage signals to the first electrode pattern and the second electrode pattern so that the UV detection structure 4 may be operated under the suitable operating voltage. The current detector 18 may be controlled by the driving chip 1200 to measure the current intensity. The obtaining circuitry 19 may be controlled by the driving chip 1200 to collect the electric current intensity from the current detector 18. The obtaining circuitry 19 may also be integrated with or connected to certain software and hardware for configuring the intensity of the UV light based on the mapping process.

The present disclosure provides an array substrate, a display apparatus including the array substrate, and a method for fabricating the array substrate. The array substrate may include a substrate and at least one UV detection structure formed on the substrate. The structure of a UV detection structure may include a photosensitive pattern, and a first electrode pattern and a second electrode pattern formed on the photosensitive pattern. Using the technical solution of the present disclosure, the UV detection structures may be fabricated directly on the array substrate without additional mounting processed for placing the UV detection structures into the display apparatus. The display apparatus is less susceptible to damages that may incur during the mounting process.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. An array substrate, comprising:
   a substrate;
   at least one ultraviolet (UV) detection structure, wherein the UV detection structure includes a photosensitive pattern on the substrate,
   a first electrode pattern and a second electrode pattern for providing an operating voltage for the at least one UV detection structure; and
   a plurality of driving transistors for driving corresponding pixel units to display images, wherein:
   the plurality of driving transistors are in an active area and the at least one UV detection structure is in a peripheral region, the active area being a display region and the peripheral region being a non-display region, and
   the photosensitive pattern of the at least one UV detection structure and an active layer pattern of a driving transistor are formed in a same fabrication step and made of a same material.

2. The array substrate according to claim 1, wherein:
   the first electrode pattern and the second electrode pattern of the least one UV detection structure and a source pattern and a drain pattern of the driving transistor are formed in a same fabrication step and made of a same material.

3. The array substrate according to claim 1, wherein the first electrode pattern and the second electrode pattern are configured to provide the operating voltage on the photosensitive pattern so that an output electric current of the at least one UV detection structure changes according to different intensities of UV light.

4. The array substrate according to claim 1, wherein the photosensitive pattern is made of a semiconductor material with a wide bandgap.

5. The array substrate according to claim 1, wherein the at least one UV detection structure further includes a light-blocking pattern on the substrate, the photosensitive pattern being on the light-blocking pattern.

6. The array substrate according to claim 5, wherein an orthogonal projection of the light-blocking pattern on the substrate fully encloses an orthogonal projection of the photosensitive pattern on the substrate.

7. The array substrate according to claim 3, wherein the first electrode pattern and the second electrode pattern form a staggered-fingers shape, a finger of the first electrode pattern having a width of about 3 µm to about 20 µm and a length of about 10 µm to about 100 µm; a finger of the second electrode pattern having a width of about 3 µm to about 20 µm and a length of about 10 µm to about 100 µm; and a distance between a finger of the first electrode pattern and an adjacent finger of the second electrode pattern being about 3 µm to about 20 µm.

8. The array substrate according to claim 5, wherein the driving transistor includes a gate pattern on the substrate, the gate pattern and the light-blocking pattern being formed through a same fabrication step and being made of a same material.

9. The array substrate according to claim 8, wherein a gate insulating layer is on the gate pattern and the light-blocking pattern; and the active layer pattern of the driving transistor is on the gate insulating layer to correspond to the gate pattern.

10. The array substrate according to claim 1, comprising more than two UV detection structures arranged in an array and connected in parallel, wherein a total electric current of the UV detection structures is an output electric current of the array.

11. A display apparatus, including one or more of the array substrates of claim 1.

12. The display apparatus according to claim 11, further comprising:
a bias output, connected to the first electrode pattern and the second electrode pattern of the at least one UV detection structure to provide the operating voltage for the at least one UV detection structure; and
a current detector, connected to the first electrode pattern or the second electrode pattern of the at least one UV detection structure to detect an output electric current of the at least one UV detection structure.

13. The display apparatus according to claim 12, further including an obtaining circuitry, connected to the current detector and configured to calculate an intensity of UV light.

14. A method for fabricating an array substrate, including:
providing a substrate with a gate insulating layer;
forming an active layer pattern of a driving transistor and a photosensitive pattern of a ultraviolet (UV) detection structure on the gate insulating layer, the active layer pattern being formed in a display region on the substrate and the photosensitive pattern being formed in a peripheral region on the substrate;
forming a source pattern and a drain pattern of the driving transistor on the active layer pattern and forming a first electrode pattern and a second electrode pattern of the UV detection structure for providing an operating voltage for the UV detection structure.

15. The method according to claim 14, wherein the photosensitive pattern of the UV detection structure and the active layer pattern of the driving transistor are formed in a same fabrication step and are made of a same material.

16. The method according to claim 14, wherein the source pattern and the drain pattern of the driving transistor and the first electrode pattern and the second electrode pattern of the UV detection structure are formed in a same fabrication step and are made of a same material.

17. The method according to claim 14, further including:
forming a gate pattern in the display region before forming the active layer pattern and the photosensitive pattern, the active layer pattern corresponding to the gate pattern; and
forming a light-blocking pattern on the substrate in a same fabrication step as that of forming the gate pattern, an orthogonal projection of the light-blocking pattern on the substrate fully enclosing an orthogonal projection of the photosensitive pattern on the substrate.

18. The method according to claim 17, wherein the photosensitive pattern is positioned above the light-blocking pattern.

* * * * *